United States Patent [19]

Dornes et al.

[11] Patent Number: 4,573,262

[45] Date of Patent: Mar. 4, 1986

[54] APPARATUS FOR FORCE FITTING COMPONENTS INTO A WORKPIECE

[75] Inventors: Bryan J. Dornes, Hershey; Edward J. Paukovits, Jr., Hummelstown; Richard V. Spong, Etters; Robert J. Talarico, Mechanicsburg, all of Pa.

[73] Assignee: AMP Incorporated, Harrisburg, Pa.

[21] Appl. No.: 609,387

[22] Filed: May 11, 1984

[51] Int. Cl.⁴ .............................................. B23P 21/00
[52] U.S. Cl. ...................................... 29/739; 29/742; 29/759; 29/771; 29/783; 29/822
[58] Field of Search ................. 29/739, 740, 741, 742, 29/743, 759, 771, 783, 791, 822, 823

[56] References Cited

U.S. PATENT DOCUMENTS 3,740,817  6/1973  Weiler et al. ...................... 29/203 B
4,231,153  11/1980  Browne ................................ 29/739

Primary Examiner—Howard N. Goldberg
Assistant Examiner—Leonard S. Selman
Attorney, Agent, or Firm—Jay L. Seitchik

[57] ABSTRACT

Apparatus for force fitting components into a workpiece comprises a gantry supporting two insertion heads above an indexable support for the workpiece, a workpiece pick-up station on each side of the workpiece, and rods by which the insertion heads are suspended from the gantry and which are rotatable to translate the insertion heads between positions over the pick-up stations and positions over the workpiece and to operate tooling of the insertion heads to pick-up components from the pick-up station and to force fit them into the workpiece. The apparatus is programmed so that when one of the insertion heads is located over a pick-up station the other is located over the workpiece.

13 Claims, 15 Drawing Figures

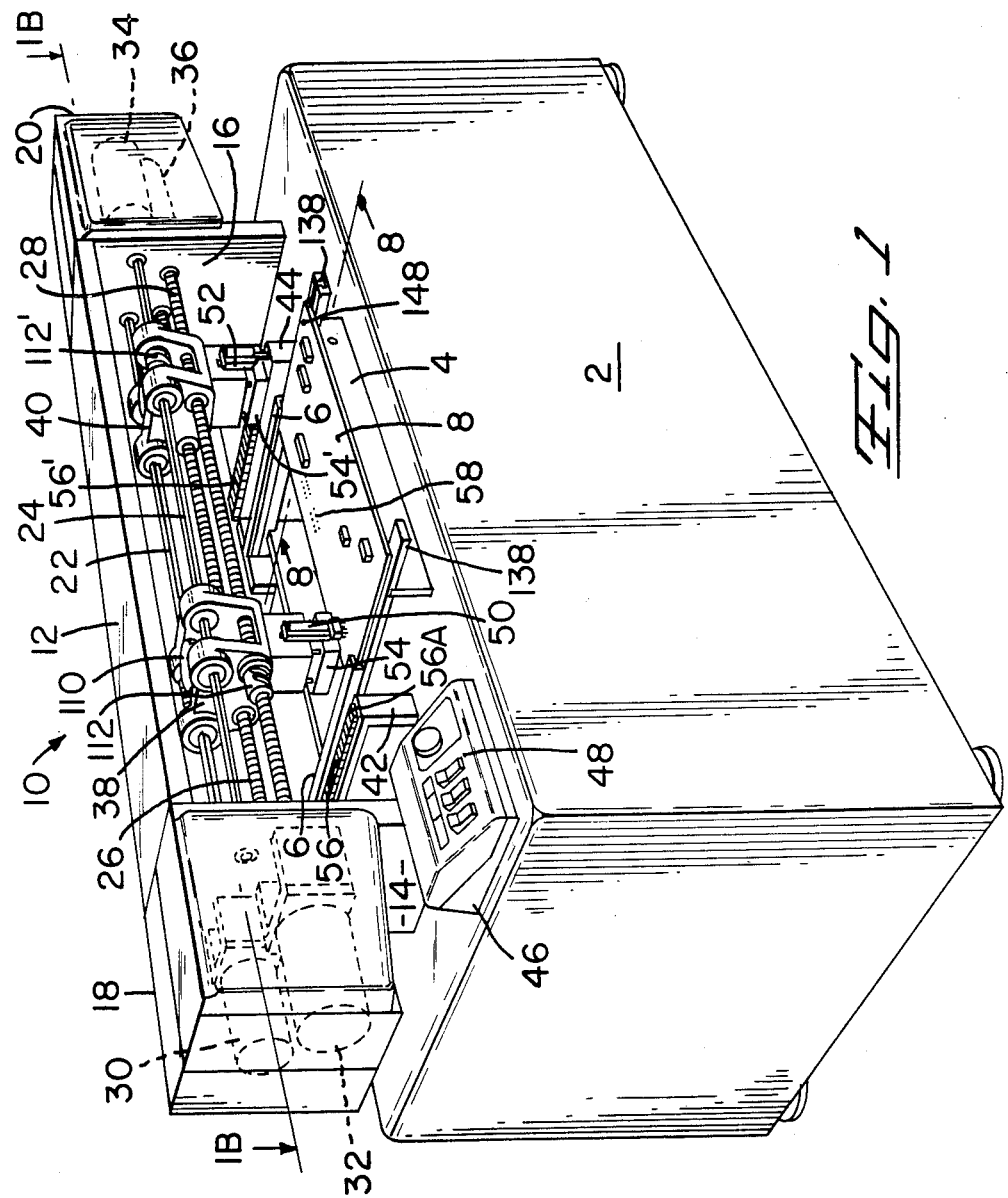

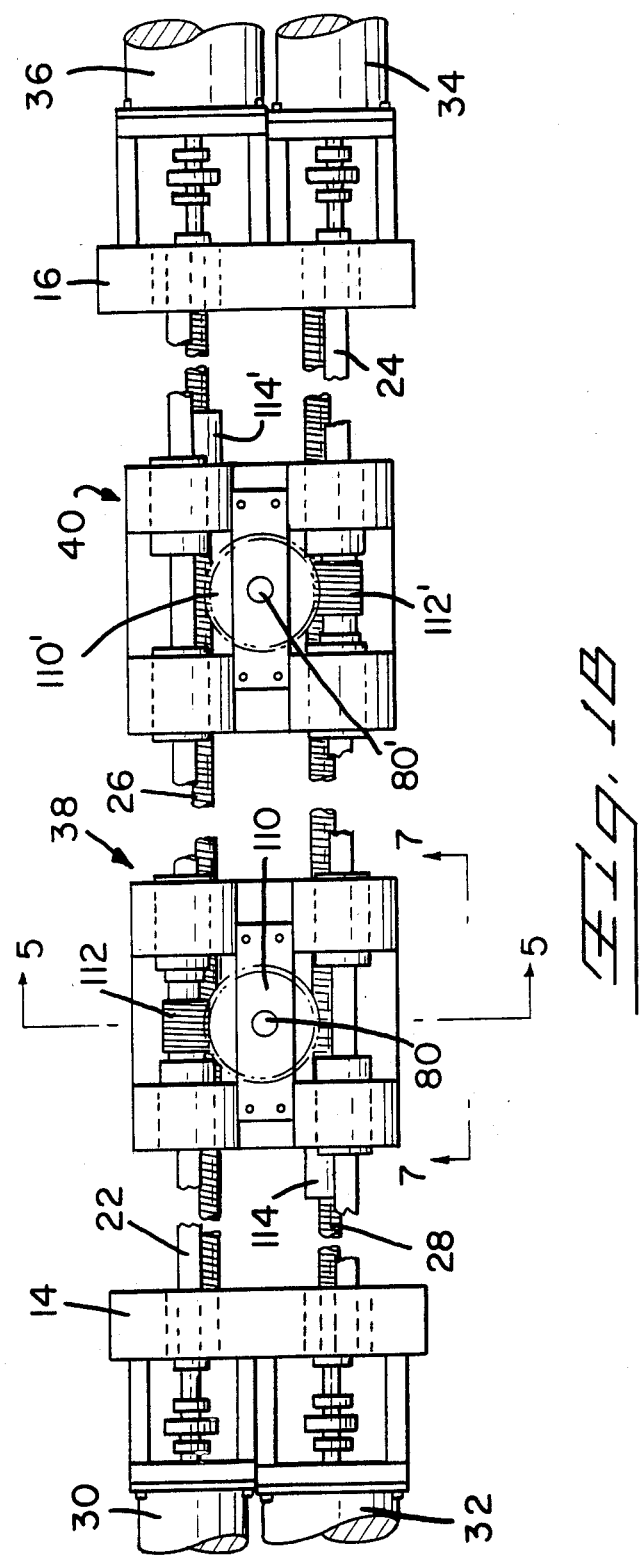

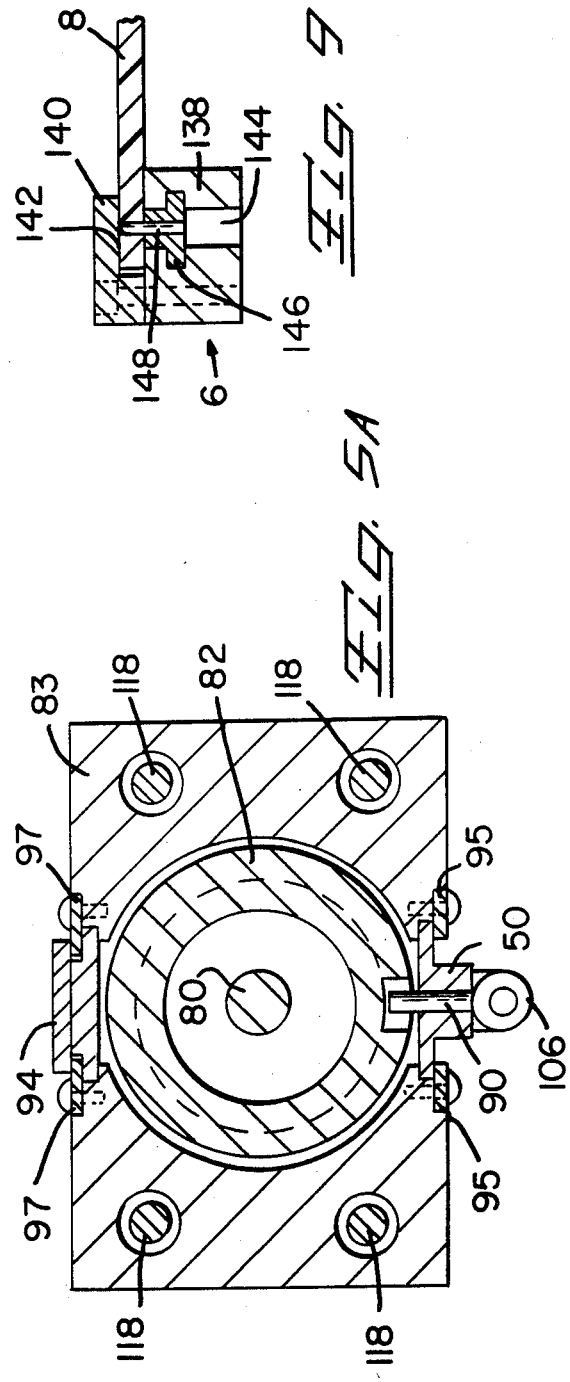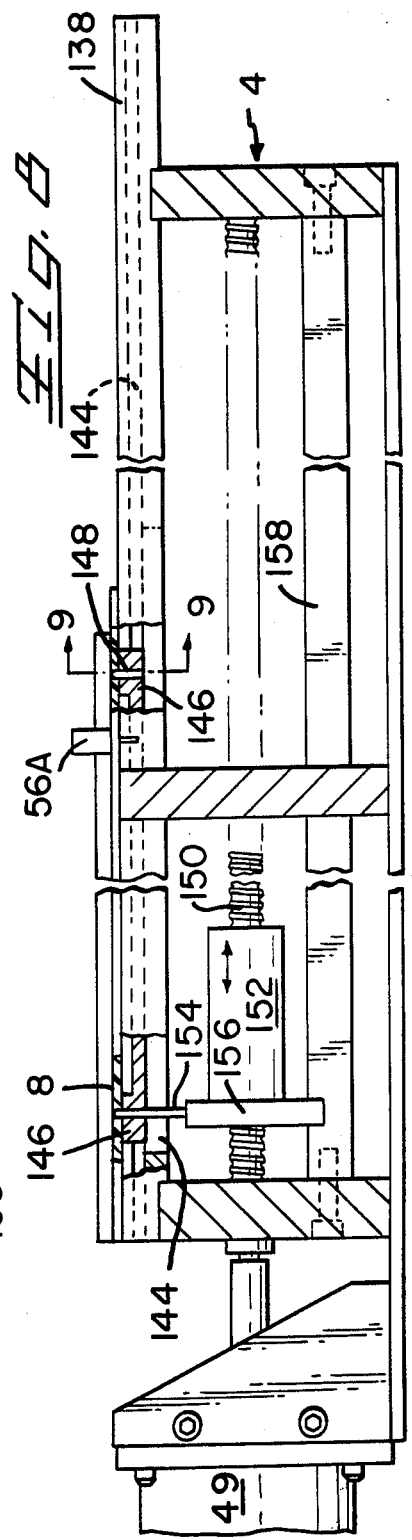

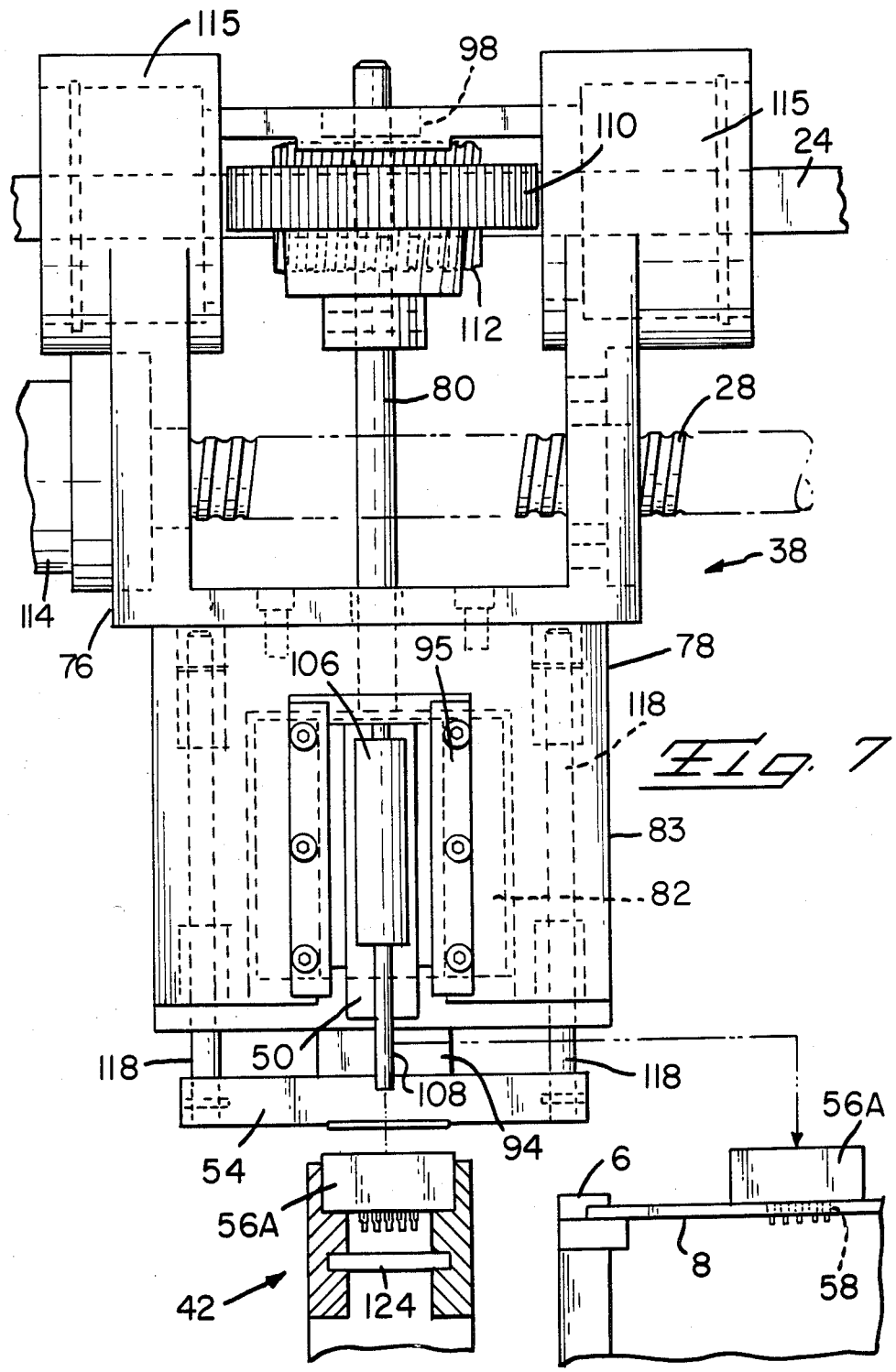

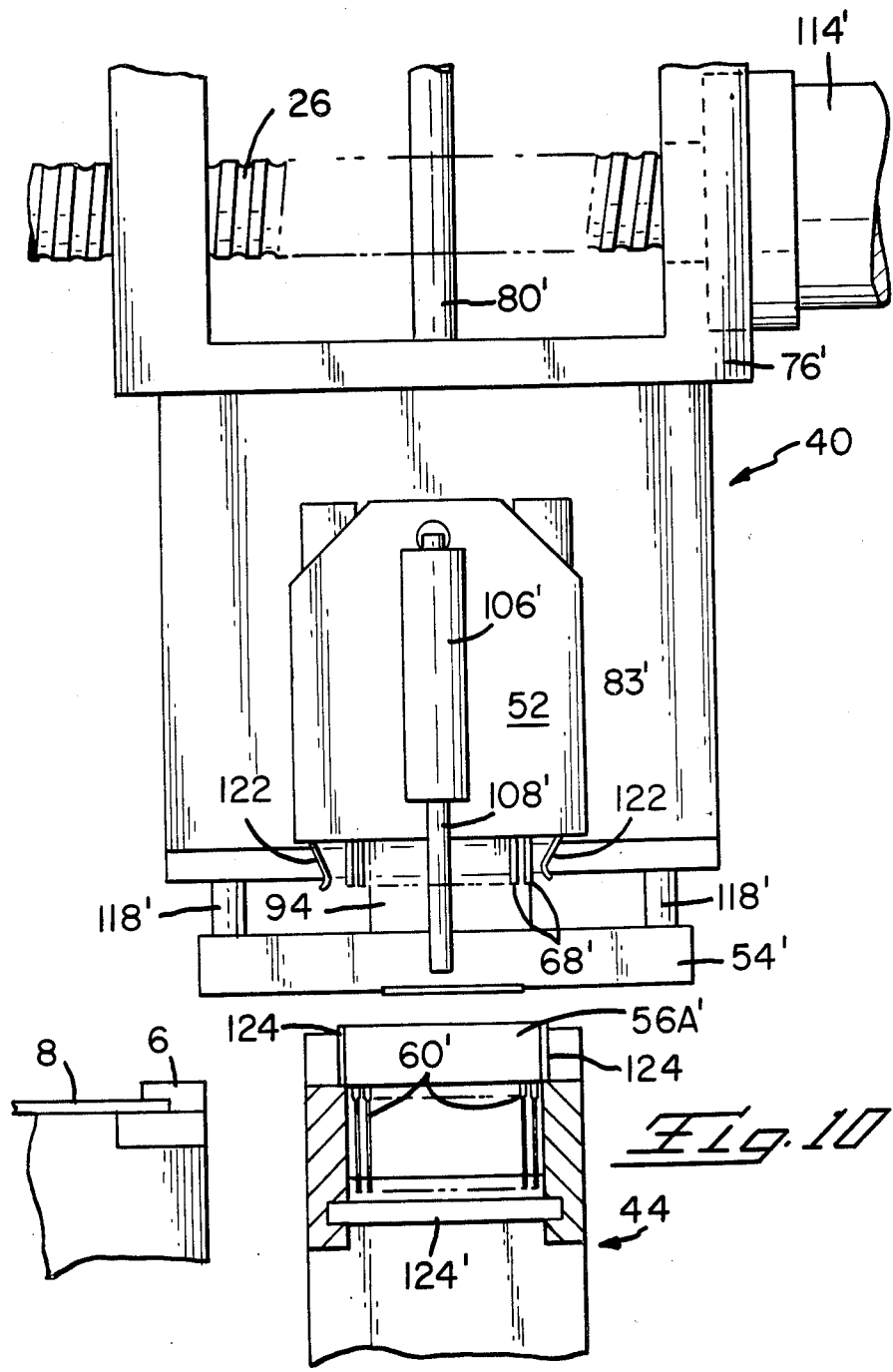

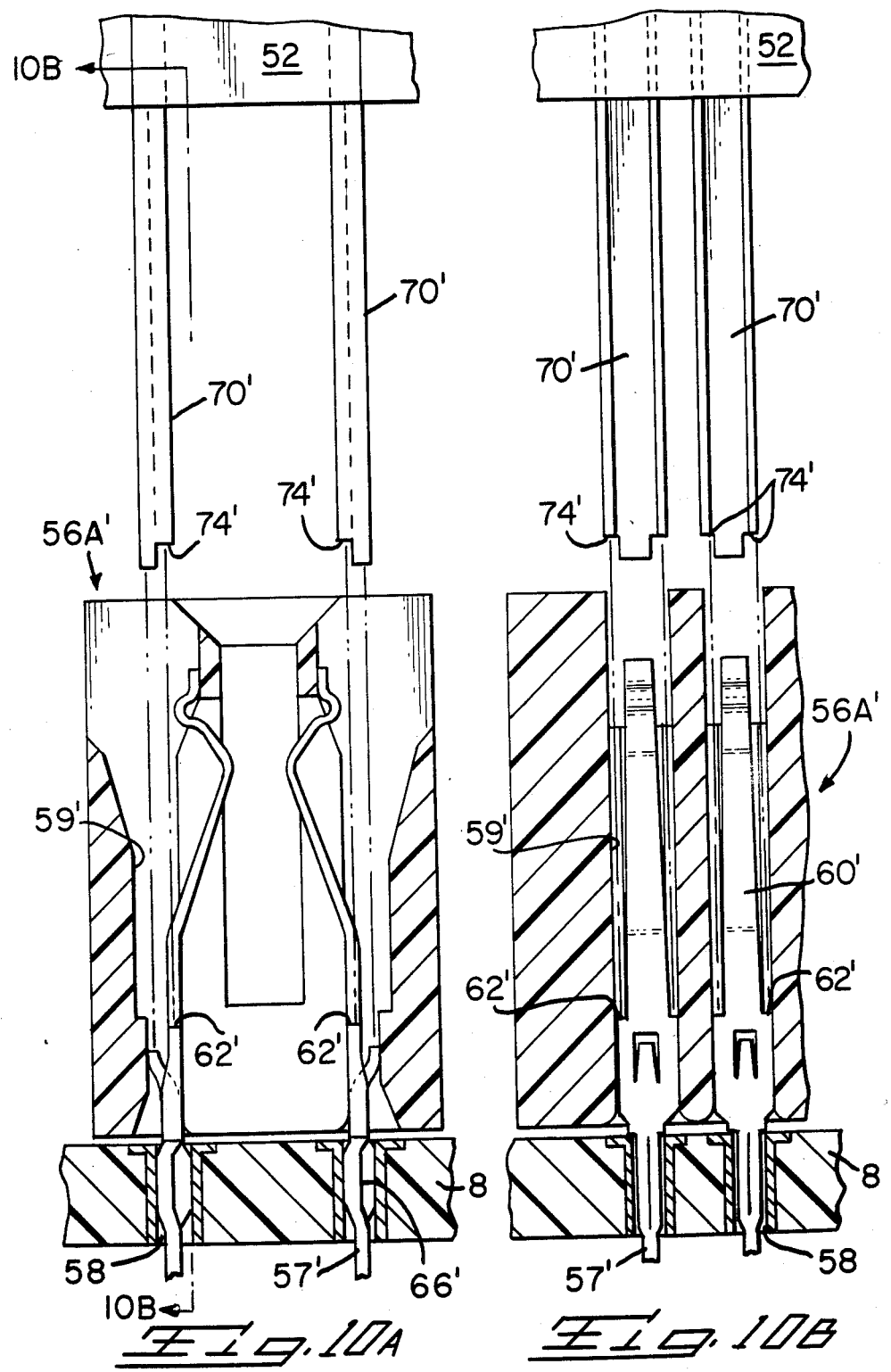

APPARATUS FOR FORCE FITTING COMPONENTS INTO A WORKPIECE

This application relates to apparatus for force fitting components, especially electrical components, into a workpiece, which may be, for example, a circuit board or other substrate.

Some electrical components, may comprise pins for insertion into the workpiece. A pin, which is particularly useful for this purpose, and which is retained in the workpiece against substantial pulling forces, comprises a split mounting portion which is oversized with respect to a hole in the workpiece into which it is to be force fitted, the two parts of the split mounting portion frictionally engaging one another as the pin is force fitted into the hole. Such a pin, which is described in U.S. Pat. No. 4,186,982 may require an insertion force of some fifty pounds in order to force fit it into the hole. Where, as may sometimes be the case, the component comprises a plurality of such pins, for example, ten, the total insertion force will amount to a multiple of the force required to insert each pin thereof. Thus, the force required to insert a component comprising 10 such pins, can amount to about 500 pounds. A problem associated with apparatus for inserting such components into a workpiece, is that if such high insertion forces are to be generated, the apparatus will be correspondingly slow in operation. Although it has been sought to overcome this problem by so arranging the mounting portions of the pins that the insertion force is reduced, the withdrawal force needed to extract the pins from the workpiece is also correspondingly reduced.

It is an object of this invention to provide apparatus for force fitting components into a workpiece, which apparatus is capable of delivering very substantial insertion forces and which is at the same time relatively rapid in operation.

It is another object of the invention to provide such apparatus in which the tolerance accumulation associated with the use of an X-Y table for supporting the workpiece is reduced.

It is a further object of this invention to provide such apparatus, which is of simple construction, having a minimum number of discrete drive means, which are easily cycled by the use of an electronic control device.

According to one aspect of the invention, apparatus for force fitting components into a workpiece, comprises means for supporting the workpiece in a given plane, first and second insertion heads, means for supporting the insertion heads for translatory movement along a predetermined path parallel to the given plane and on one side thereof, first drive means for intermittently translating the insertion heads along said path, component pick-up and insertion means moveably mounted on each insertion head, second drive means for moving the pick-up and insertion means towards and away from the given plane, a first component pick-up station on the one side of the workpiece supporting means and at one end of the predetermined path, and being associated with the first insertion head, a second component pick-up station on the opposite side of the workpiece supporting means and at the other end of the predetermined path, and being associated with the second insertion head, means for moving the workpiece at right angles to said predetermined path and in said plane, and control means for cyclically operating said drive means, so that each insertion head in turn is translated to a first position opposite to its associated component pick-up station and its component pick-up and insertion means is moved towards and away from such pick-up station to pick-up a component therefrom, and the insertion head is then translated to a second position opposite to the workpiece when such is supported by the workpiece supporting means and the component pick-up and insertion means of the insertion head is moved towards the workpiece to force fit the picked-up component thereinto.

One insertion head can be moved to its insertion position while the other is picking up a component, there by maximizing the rate of operation of the apparatus.

The heads may be translated by means of individual ball screws extending along the predetermined path and the component pick-up and insertion means may be moved towards and away from the workpiece by means of rotary rods extending along the path and being connected to rotary cam means in the insertion heads. The ball screws and rods also serve to support the insertion heads against the high insertion forces and the rods may be of rectangular cross-section or splined, for driving the pick-up and insertion means. Each rod and each ball screw, as well as the carriage may be driven by an individual motor under the control of a common electronic control device.

The rods and ball screws are preferably supported by a gantry spanning the workpiece supporting means.

Components in the form of electrical connectors may be fed to each component pick-up station, from a magazine containing a column of components. In this case, each insertion head is provided with a component hold down plate which is moved against the column of components as the component pick-up and insertion means of the insertion head is moved towards the component pick-up station. Conveniently, both the pick-up and insertion means and the hold down plate are moved by means of a barrel cam in the insertion head, which is connected to the associated rod through gearing means.

A salient advantage of the invention is that the tolerance accumulation which is experienced in the use of an X-Y table for supporting the workpiece, is reduced since the X and Y axes of relative movement between the workpiece and the component insertion means are de-coupled.

The workpiece may conveniently be driven through a ball screw acting upon a ball nut which is directly coupled to the workpiece.

According to other aspects of the invention, it relates specifically to an apparatus for force fitting pins projecting from electrical connectors into holes in a circuit board and to an insertion head for use in force fitting components into a workpiece.

For a better understanding of the invention, an embodiment thereof will now be described by way of example with reference to the accompanying drawings in which:

FIG. 1 is a general perspective view of apparatus for force fitting electrical components, in the form of electrical connectors having pins depending therefrom, into holes in a printed circuit board;

FIG. 1B is a view taken on the lines 1B—1B of FIG. 1;

FIG. 5A is a view taken on the lines 5A—5A of FIG. 5;

Figure 1A:
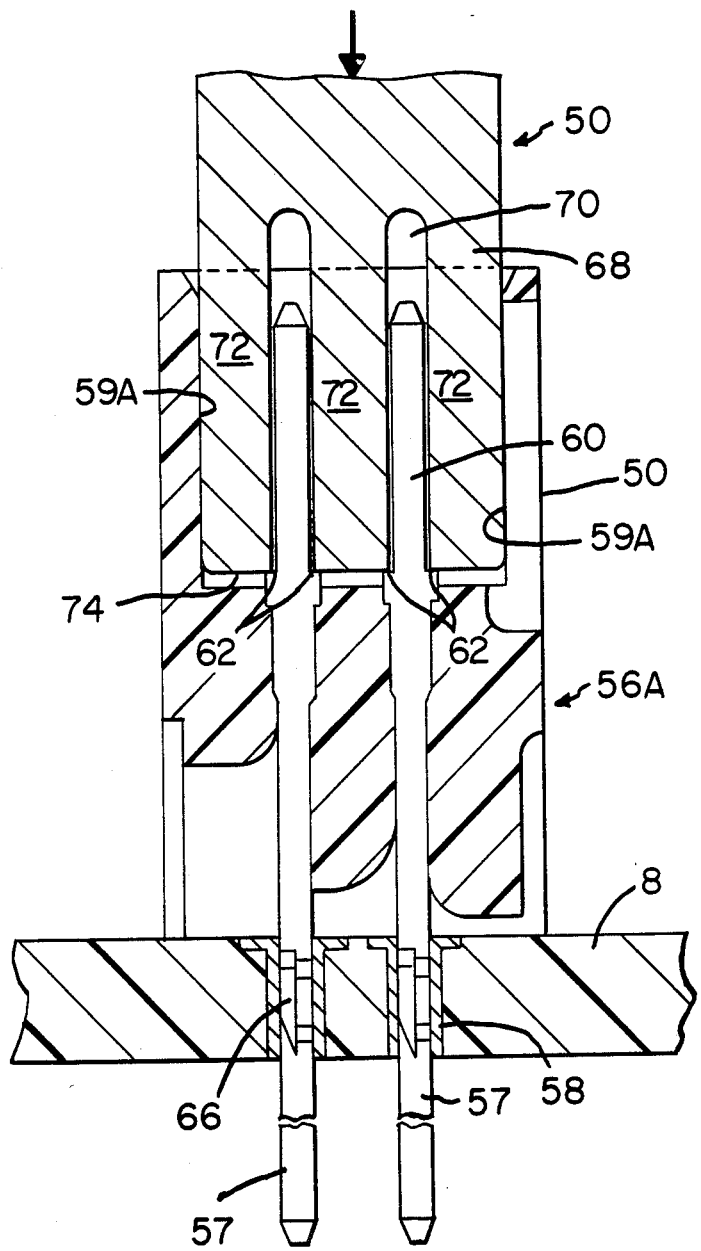
FIG. 1A is a greatly enlarged cross-sectional view showing a connector pick-up and insertion tool of the apparatus engaged with an electrical connector, after having force fitted it to a printed circuit board.

FIG. 7 is a view taken on the lines 7—7 of FIG. 1B;
FIG. 8 is a view taken on the lines 8—8 of FIG. 1;
FIG. 9 is a view taken on the lines 9—9 of FIG. 8;

FIG. 10 is a frontal view of part of an insertion head of the apparatus in association with a connector pick-up station thereof;

FIG. 10A is a greaty enlarged cross-sectional view showing a connector pick-up and insertion tool of the insertion head of FIG. 10 after having force fitted a connector to the circuit board and after having been withdrawn from the connector; and FIG. 10B is a view taken on the lines 10B—10B of FIG. 10A.

The apparatus will now be described in outline with particular reference to FIGS. 1 and 1B.

The apparatus comprises a table 2 on which is mounted a frame 4, supporting guides 6 in which a workpiece in the form of a printed circuit board 8, is mounted for movement in a horizontal plane. Also mounted on the table 2, is a gantry 10 which straddles the frame 4 and comprises a cross beam 12 and depending side plates 14 and 16 to which are secured motor housings 18 and 20, respectively. Shafts in the form of drive rods 22 and 24 of square cross section, and drive ball screws 26 and 28, all of which are horizontal and extend parallel to one another, span, and are supported by, the plates 14 and 16, the rod 22 and the ball screw 28 projecting into the housing 18 and being connected respectively to drive stepping motors 30 and 32 therein. The rod 24 and the ball screw 26 project into the housing 20 and are respectively connected to drive stepping motors 34 and 36 therein. The motors are arranged to drive the said shafts in either sense of rotation. The said rods and ball screws extend through and support aligned component pick-up and insertion heads 38 and 40. On either side of the frame 4 and within the gantry 10, are respective connector, that is to say, component, pick-up stations 42 and 44. Mounted in the table 2 is a programmable electronic control device 46 having a control panel 48, for cylical operation of the stepping motors mentioned above and a further stepping motor 49 (FIG. 8) for driving the board 8 along the guides 6.

The rods 22 and 24 are arranged in driving relationship with connector pick-up and insertion tools 50 and 52 of the heads 38 and 40, respectively, the ball screws 26 and 28 serving to drive the heads 40 and 38, respectively, lengthwise thereof and, thus, along a horizontal path parallel to, and above, the plane of the board 8. The heads 38 and 40 are provided with hold down plates 54 and 54' respectively, these also being driven by the respective rods 22 and 24.

Each pick-up station 42 and 44 comprises a magazine containing a column of electrical connectors 56 or 56' which is urged forwardly (as seen in FIG. 1) so that the leading connector 56A or 56A' (FIG. 10) of the column is positioned at the near (as seen in FIG. 1) end of the magazine. Each connector has pins 57 (FIG. 1A) depending therefrom for force fitting into appropriate holes 58 in the board 8.

Figure 2:
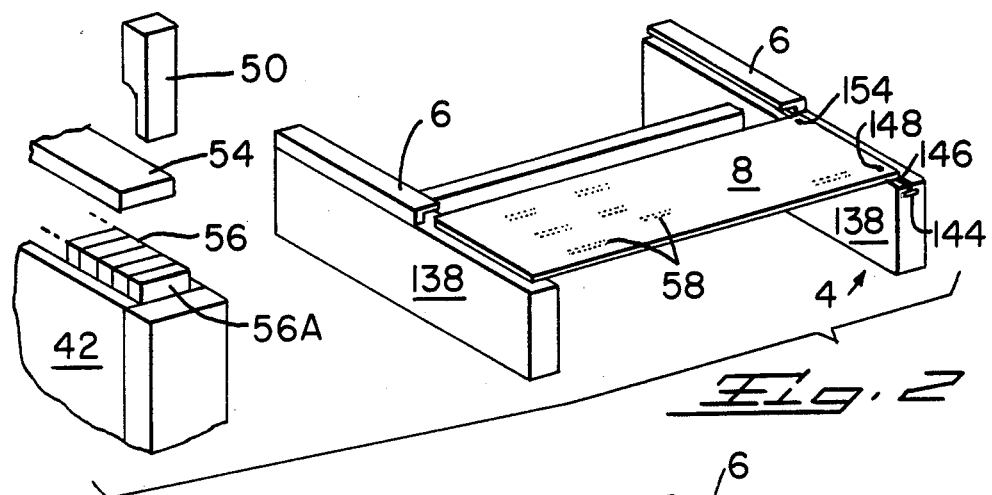
FIGS. 2 to 4 are diagrammatic perspective action views illustrating the operation of a connector pick-up and insertion tool and workpiece supporting means of the apparatus.
Figure 3:
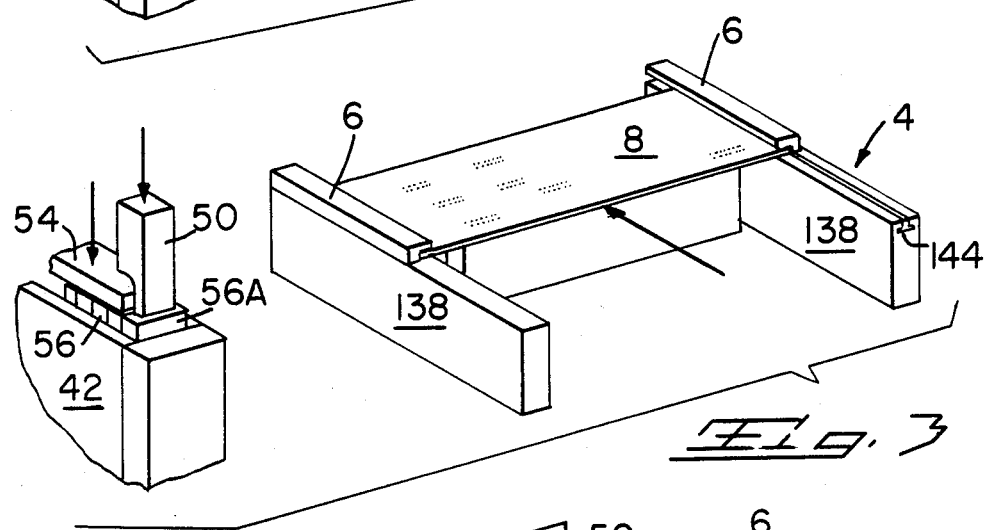
Figure 4:
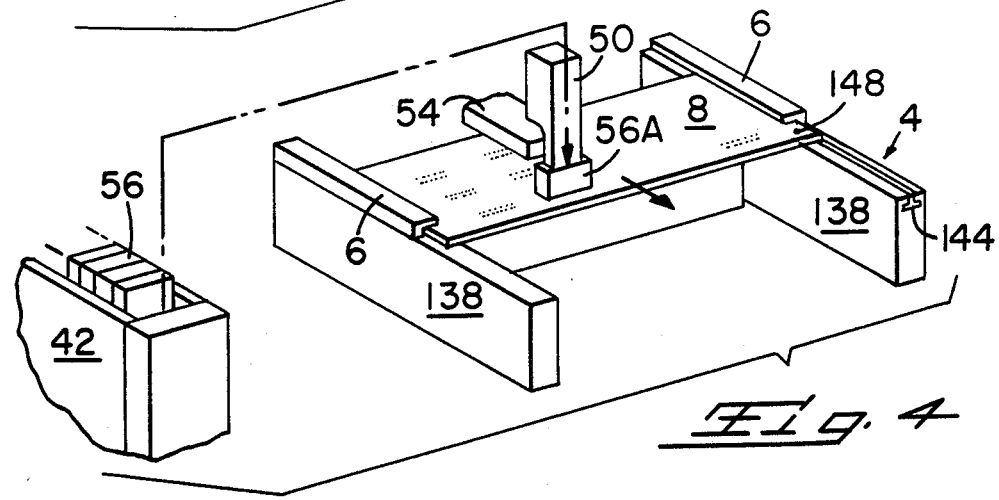

In operation, the stepping motors 30, 32, 34 and 36 are so controlled by the device 46, that each insertion head in turn, is first placed in a pick-up position opposite to its associated pick-up station with the pick-up and insertion tool and the hold down plate of the head in a raised position, the tool and the plate being then lowered so that the hold down plate engages the column of connectors at the pick-up station, back from the leading connector, and the tool then engages in the leading connector. The tool is then raised, followed by the hold down plate and the head is translated to a predetermined position over the board 8 after which the tool is again lowered to force the pins on the leading connector into appropriate holes 58 in the board 8. Whilst one of the heads is positioned over its associated pick-up station, the other is in its insertion position, as shown in FIG. 1, whereby the operating speed of the apparatus is maximized. After having performed its insertion operation, each head is returned to its pick-up position. The operation of the head 38 which carries the connector pick-up and insertion tool 50 is illustrated in FIGS. 2 to 4. The head 40 is operated in a corresponding manner. When the heads 38 and 40 have been operated as described above, the motor 49 is actuated to index the board 8 to receive further connectors 56 and 56'.

As best seen in FIG. 1A, each connector 56, as exemplified by the connector 56A, comprises an insulating housing 59 containing rows of electrical terminals 60 secured in the housing 59 and having shoulders 62 and pins 57 depending from the housing 59. Each pin 57 has a mounting portion 66 adapted to be force fitted by means of the pick-up and insertion tool 50 into a hole 58 in the board 8. These mounting portions may be according to U.S. Pat. No. 4,186,982, mentioned above, and which is incorporated herein by reference.

The connectors 56' are longer than the connectors 56.

The connector insertion and pick-up tool 50 has at its working end 68, slots 70, defining legs 72 the outer ones of which frictionally engage respective side walls 59A, of the housing 59 so that the tool can pick-up the connector 56 from its pick-up station, as the tool is raised. Shoulders 74 in which the legs 72 terminate, engage the shoulders 62 of the terminals during the force fitting operation, so that the housing 59 is mainly relieved of the insertion forces. As the tool is raised, the legs 72 slide out of the housing 59, since the terminals are then securely fixed in the holes 58 in the board 8.

The tool 52 is similar to the tool 50 but is adapted to the connectors 56'.

Details of the apparatus will now be described with reference to FIGS. 5 to 10.

Figure 5:
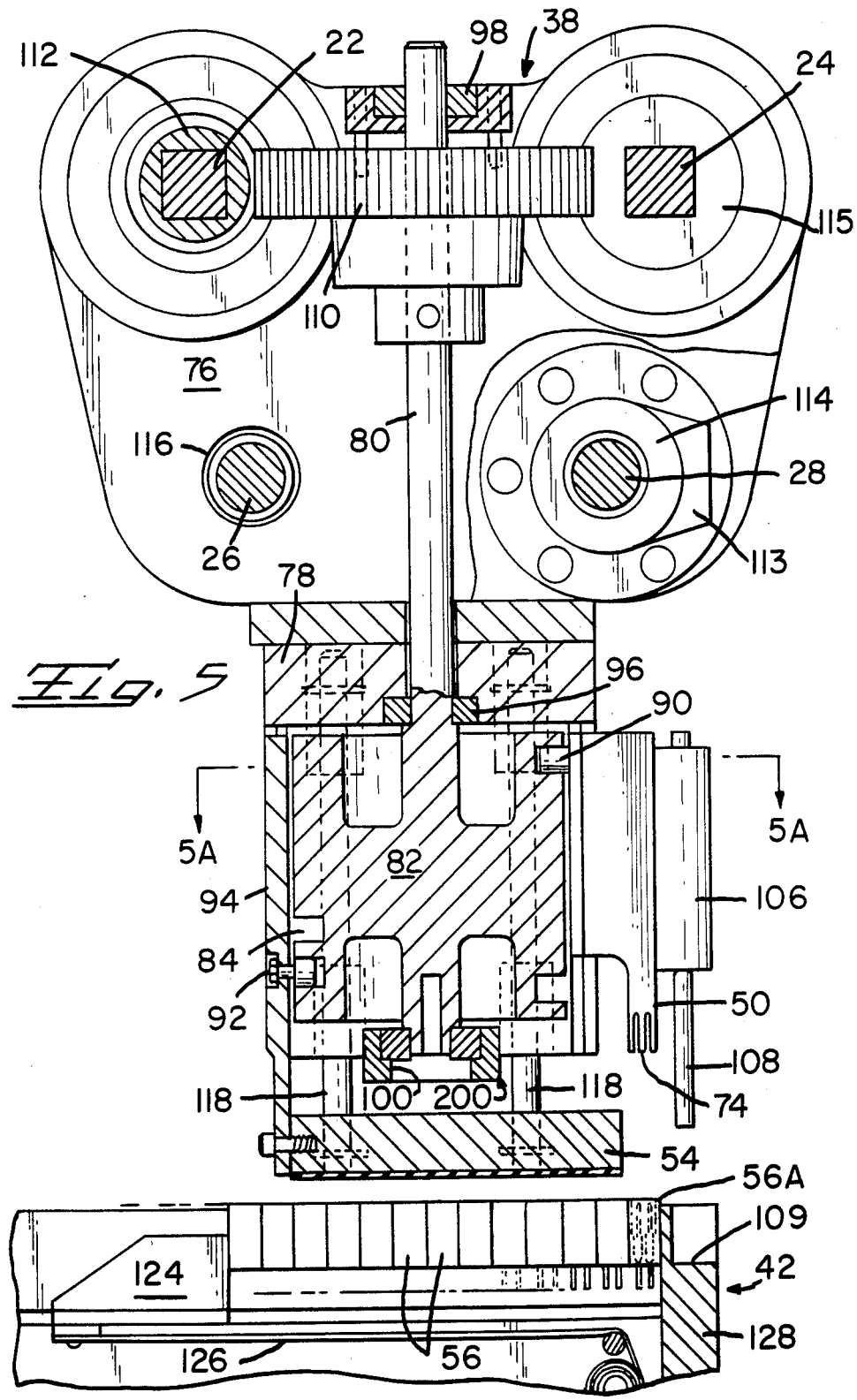
FIG. 5 is a view taken on the lines 5—5 of FIG. 1B, showing an insertion tool and a connector hold down plate of the apparatus in a raised position.

As best seen in FIGS. 5, 5A and 7, the insertion head 38 comprises a shaft receiving part viz. a clevis 76 through bearings in which the rods 22 and 24 and the ball screws 26 and 28, respectively, pass. Mounted in a bearing block 78 at the base of the clevis 76, is a vertical shaft 80 formed integrally with the lower end of which is a barrel cam 82 provided with cam tracks 84 and 88 in which ride cam followers 90 and 92, respectively. The cam 82 is contained in a barrel cam housing 83, formed integrally with block 78 and together therewith constituting a barrel cam supporting part of the head 38. The cam follower 90 is connected to the tool 50 directly, the cam follower 92 being connected through a slide 94 with the hold down plate 54. The tool 50 and the slide 94 are slidable in guideways provided by plates 95 and 97, respectively, on the housing 83. The shaft 80 is rotatable in bearings 96 and 98 in the block 78 and in the clevis 76, respectively, the barrel cam 82 being also supported by a bearing 100 in a bearing block 200 secured to the housing 83. A linear variable differential transformer 106 having a core 108 projecting beyond the shoulders 74 of the tool 50 is mounted thereon to cause reverse drive of the rod 22 by the motor 30 when the core 108 bottoms on a shoulder 109 of the pick-up station 42. Fixed to the shaft 80 is a pinion 110 which meshes with a worm gear 112 fixed to the rod 22. Fixed to the clevis 76 by means of a flange 113, is a ball nut 114 with which the ball screw 28 meshes. The rod 24 passes through a bearing 115 in the clevis 76, the ball screw 26 passing through a clearance holes 116 therein.

When the motor 32 is actuated, the ball screw 28 cooperates with the nut 114 to translate the head 38 in a direction along the ball screw 28 which is determined by the program of the device 46, to position the tool 50 over the station 42, actuation of the motor 30 causing the worm gear 112 to rotate the pinion 110 and thus the shaft 80 so that the tool 50 is lowered to engage in the connector 56A and the plate 54 is lowered to engage the column of connectors 56. When the core 108 strikes the shoulder 109, the rotation of the cam 82 is reversed so that the tool 50 is raised to lift it from the pick-up station 42 and the hold down plate 54 is raised from the column of connectors 56 after the connector 56A has been lifted clear thereof by the tool 50.

Figure 6:
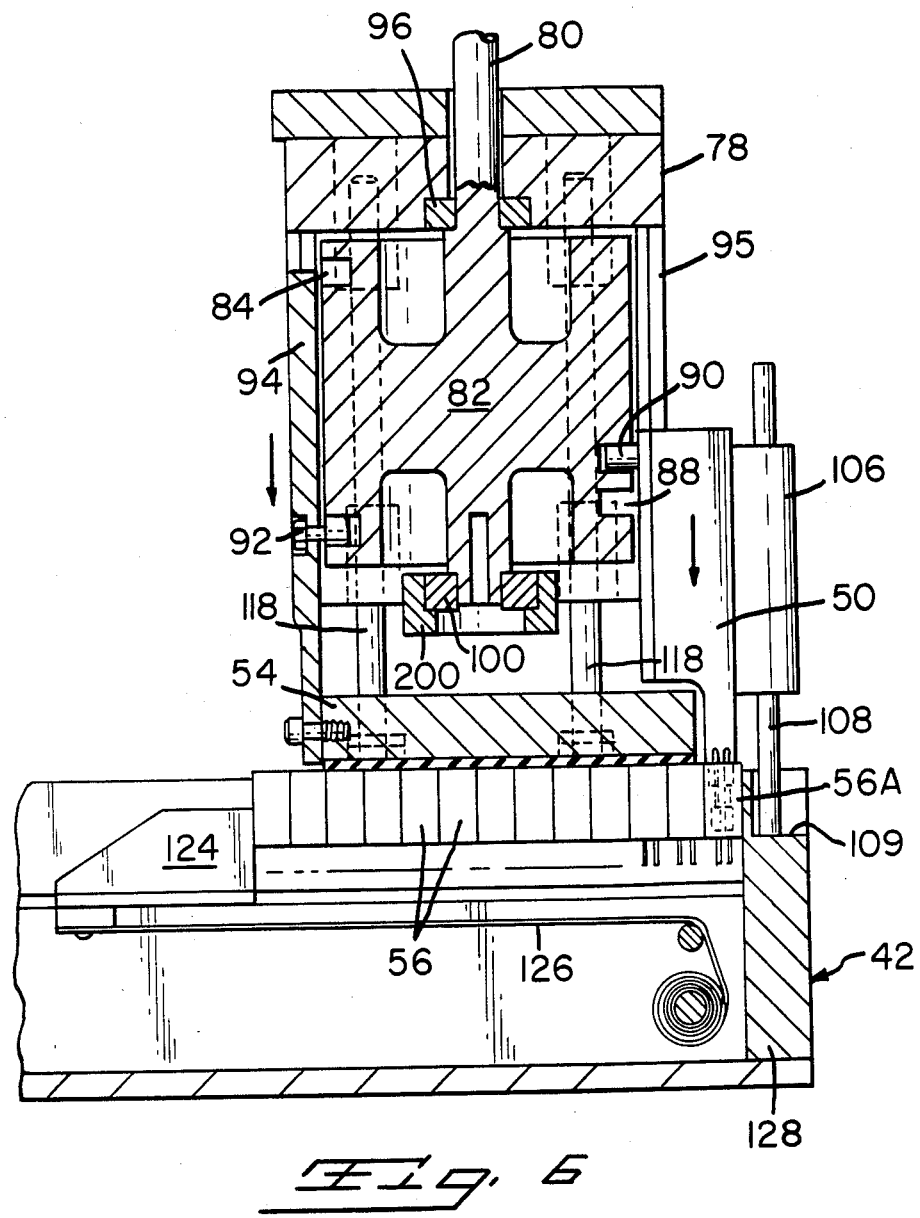
FIG. 6 is a similar view to that of FIG. 5, but with parts removed, showing the tool and the hold down plate in a lowered position and illustrating a further portion of the apparatus.

The hold down plate 54 is stabilized by posts 118 which are fixed thereto and are slidable in the housing 83 and support block 78. FIG. 6 shows the plate 54 in engagement with the column of connectors 56 as the tool 50 enters the leading connector 56A.

When the connector 56A has been picked up by the tool 50, the motor 32 is operated to translate the head 38 to a predetermined position over the board 8, after which the motor 32 is stopped, and the motor 30 is operated again to rotate the barrel cam 82 so that the tool 50 descends to force fit the pins of the connector 56A, into predetermined holes in the board 8, when the core 108 has bottomed on the board 8, the tool 50 is raised again leaving the connector secured to the board. The insertion force is taken up by the gantry 10 through the rods 22 and 24, and ball screws 26 and 28.

The head 40 (the parts of which having the same function as corresponding parts of the head 38, bear the same reference numerals, but with the addition of a prime symbol) is the same as the head 38 excepting that the ball screw 26 engages in a ball nut 114' on the clevis 76' of the head 40, the rod 24 being provided with a worm gear 112', which meshes with a pinion 110' connected to the barrel cam shaft 80' of the head 40, the rod 22 serving only as a support for the head 40, and the ball screw 28 simply passing through the clearance holes 116 in the clevis 76'.

The above will be apparent from FIGS. 1B and 10.

Also, the tool 52 differs from the tool 50 in that it is intended to pick-up and force fit to the board 8, connectors 56' which are of greater length than the connectors 56. On each side of its legs 70', the tool 52 is provided with a clip 122 for engagement with the end external walls 124 of the leading connector 56A' of the column of connectors 56'. In operation of the head 40, the motor 34 is first operated to rotate the shaft 24 to drive through the worm 112', pinion 110' and barrel cam shaft 80' the tool 52 into engagement with the connector 56A' after the hold down plate 54 has engaged the column of connectors and to raise the tool 52 to pick up the connector 56A', after which the motor 36 is operated to translate the head 40 to its predetermined position over the board 8, through the ball screw 26 and ball nut 114', after which the motor 34 is operated to cause the tool 52 to force fit the pins 57' of the connector 56A' into their predetermined holes 58 in the board 8, after which the tool 52 is raised leaving the connector 56A' secured to the board 8, as shown in FIGS. 10A and 10B. The motor 36 is driven in the reverse direction to return the head 40 to its pick-up position over the pick-up station 44, and so on.

As shown in FIGS. 10A and 10B, the legs 70', one of which is provided for each terminal 60' of connector 56A', have shoulders 74' which engage shoulders 62' on the terminals 60' during the force fitting operation, so that the housing 59' of the connector is mainly relieved of the high insertion forces needed to drive the mounting portions 66' of the terminals 60' into the holes 58.

As best seen in FIG. 6, the pick-up station 42, comprises a slide 124 which is urged by a draw spring 126 against the column of connectors 56 to urge it against an end wall of a frame 128 supporting the slide 124. The pick-up station 44 is identically arranged excepting that it is adapted to receive connectors of greater length than the pick-up station 42. It has an identical slide 124' (FIG. 10).

As best seen in FIGS. 8 and 9 each guide 6 comprises a beam 138 supported on the frame 4 and to which is secured a gib 140, extending a little less than half way along the length of the beam 138, from its leftward, as seen in FIG. 8, end and defining in cooperation with the beam 138 a groove 142 for receiving one of two opposite margins of the board 8.

One of the beams 138 is formed with a through, longitudinal channel 144 which is recessed laterally to receive and support a slide 146, and extends up to the right hand, as seen in FIG. 8, end of the beam 138. A spigot 148 upstands from the slide 146.

A ball screw 150 connected to the motor 49 and which is rotatable thereby in either sense under the command of the control device 46, is supported in the frame 4 beneath said one beam 138, and meshes with a ball nut 152 provided with a flange 156 which straddles a rod 158 in the frame 4 to restrain the nut 152 against rotation with the screw 150. A spigot 154 projects from the flange 156 through the channel 144 and also through the slide 146.

The device 46 is so programmed that after each board 8 has been loaded with electrical connectors by the apparatus, the motor 49 is operated to advance the slide 146 to its fully rightward, as seen in FIG. 8, position, so that the loaded board 8 is clear of the gibs 140 and can, thus, be easily lifted from the apparatus.

When the next board 8 is to be processed, the free end portions of the spigots 148 and 154 are passed through holes in one end of the board 8, as the board is laid on the beams 138, as shown diagramatically in FIG. 2. Upon a start button on the control panel 48 being pressed, the motor 49 is actuated to withdraw the board 8 back between the guides 6 (FIG. 3). The heads 38 and 40 are then operated to apply a first row of connectors 56 and 56' to the board and the motor 49 is operated to step the board forward, between the guides 6 as indicated in FIG. 4, and so on, until the board has been advanced again to its FIG. 2 position.

The connector pick-up stations and the tooling of the insertion heads should be exchangeable to permit the application of different kinds and sizes of connector by means of the apparatus.

If more than two kinds of connector are to be applied to the same circuit board, more than one gantry, with its associated insertion heads and drive motors may, to this end, be mounted on the table.

We claim:

1. Apparatus for force fitting components into a workpiece, comprising means for supporting the workpiece in a given plane, first and second insertion heads, means for supporting the insertion heads for translatory movement along a predetermined path parallel to the given plane and on one side thereof, first drive means for intermittently translating the insertion heads along said path, component pick-up and insertion means moveably mounted on each insertion head, second drive means for moving the pick-up and insertion means towards and away from the given plane, a first component pick-up station on the one side of the workpiece supporting means and at one end of the predetermined path, and being associated with the first insertion head, a second component pick-up station on the opposite side of the workpiece supporting means and at the other end of the predetermined path, and being associated with the second insertion head, means for moving the workpiece at right angles to said predetermined path and in said plane, and control means for cyclically operating said drive means, so that each insertion head in turn is translated to a first position opposite to its associated component pick-up station and its component pick-up and insertion means is moved towards and away from such pick-up station to pick-up a component therefrom, and the insertion head is then translated to a second position opposite to the workpiece when such is supported by the workpiece supporting means and the component pick-up and insertion means of the insertion head is moved towards the workpiece to force fit the picked-up component thereinto, in which apparatus the drive means are so controlled that whilst one insertion head is in its first position the other insertion head is in its second position.

2. Apparatus according to claim 1, in which the insertion heads are mounted on shafts extending lengthwise of said predetermined path and being rotatable to translate said heads and to move the component pick-up and insertion means of the heads towards and away from said plane.

3. Apparatus according to claim 1, in which the translatory movement of said heads is carried out by means of a first ball screw meshing with a ball nut fixed to the first head and a second ball screw meshing with a ball nut fixed to the second head, each ball screw being connected to an individual reversible drive means.

4. Apparatus according to claim 1, in which said insertion heads have component hold down plates thereon and the component pick-up and insertion means of the insertion heads are driven towards and away from said given plane by means of rods extending along said predetermined path and being connected to barrel cams in said heads, said cams acting to drive the connector pick-up and insertion means as well as said component hold down plates on the heads, upon rotation of the rods by drive motors connected thereto.

5. Apparatus according to claim 4, in which variable differential transformers are provided for reversing the rotation of said rods, the component pick-up and insertion means, as well as the connector hold down plates being moved away from said plane, under the control of said linear variable differential transformers which act to reverse the rotation of said rods in response to the positions of said pick-up and insertion means in relation to said given plane.

6. Apparatus according to claim 4, in which the component pick-up and insertion means of each head is in the form of a tool which is engageable in a component to be picked up, and from which projects a cam follower riding in a first cam track in the barrel cam, of said head, the hold down plate being connected to a cam follower riding in a second cam track of such barrel cam.

7. Apparatus according to claim 6, in which each component pick-up station receives a column of components urged by spring means to cause the leading component of the column to be located at a pick-up position for engagement by the pick-up and insertion tool of the associated insertion head, the component hold down plates acting to hold down the components of the columns, whilst the leading components are picked up by the tools.

8. Apparatus according to claim 1, in which the workpiece is supported by a pair of spaced beams provided with gibs defining opposed grooves for receiving the workpiece, a slide which is slidable longitudinally of the beam and which is engageable with the workpiece being driven by a ball screw having a ball nut thereon and being connected to driving means controlled by the control means to index the workpiece along the grooves and finally to a position in which the workpiece is beyond the gibs.

9. Apparatus according to claim 1, in which each insertion head comprises a shaft receiving first part, first and second bearings therein, a first shaft received in the first bearing, a second shaft in the form of a ball screw received in said second bearing and extending parallel to said first shaft, a first gear on said first shaft, a ball nut meshing with said second shaft, means securing the ball nut to said first part, a cam supporting second part secured to said first part, a cam supported by said second part for rotation about an axis perpendicular to said shafts, a second gear connected to the cam and meshing with the first gear, first and second cam tracks formed in said cam, first and second guide ways defined by said second part and extending axially of said cam, a component insertion first tool slidable in the first guideway, a cam follower on said tool riding in said first cam track, a second tool slidable in said second guideway and a second cam follower on said second tool riding in said second cam track; whereby upon rotation of said second shaft, the insertion head is translated there along, and upon rotation of said first shaft the cam is rotated to drive said tools.

10. An insertion head according to claim 9, in which said first part is provided with third and fourth bearings through which respective third and forth shafts pass, the third shaft being of square cross-section and the fourth shaft being in the form of a ball screw.

11. An insertion head according to claim 9, in which the first shaft is of square cross-section.

12. An insertion head according to claim 9, in which the first gear is a worm gear, the second gear being a pinion mounted on a shaft extending from the cam, which is a barrel cam.

13. An insertion head according to claim 9, in which second tool is in the form of a component hold down plate mounted on rods which are slidable in said first part, the second cam follower protruding from an extension of the hold down plate, which projects at right angles therefrom and is received in the second guideway.

* * * * *